United States Patent
Guo et al.

(10) Patent No.: US 8,691,599 B2
(45) Date of Patent: Apr. 8, 2014

(54) PARAMETER EXTRACTION METHOD FOR SEMICONDUCTOR DEVICE

(75) Inventors: Jyh-Chyurn Guo, Hsinchu (TW); Kuo-Liang Yeh, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 487 days.

(21) Appl. No.: 13/137,190

(22) Filed: Jul. 27, 2011

(65) Prior Publication Data

US 2012/0197593 A1    Aug. 2, 2012

(30) Foreign Application Priority Data

Jan. 31, 2011   (TW) .............................. 100103721 A (51) Int. Cl.
   *G01R 31/26*   (2006.01)
   *H01L 21/66*   (2006.01)

(52) U.S. Cl.
   CPC ............... *H01L 22/34* (2013.01); *H01L 22/32* (2013.01); *H01L 22/30* (2013.01)
   USPC .............................................. 438/17; 438/14

(58) Field of Classification Search
   CPC ......... H01L 22/12; H01L 22/14; H01L 22/30; H01L 22/32; H01L 22/34; H01L 27/0203
   USPC ......... 438/14, 17; 324/762.01, 762.1, 762.09; 716/136
   See application file for complete search history.

(56) References Cited

U.S. PATENT DOCUMENTS

| | | | |
|---|---|---|---|
| 2004/0163071 A1* | 8/2004 | Hayashi | 716/18 |
| 2005/0088186 A1* | 4/2005 | Maciejewski et al. | 324/671 |
| 2009/0184316 A1* | 7/2009 | Hsu et al. | 257/48 |

* cited by examiner

*Primary Examiner* — Charles Garber
*Assistant Examiner* — Brigitte Paterson
(74) *Attorney, Agent, or Firm* — Bacon & Thomas, PLLC (57) ABSTRACT

A parameter extraction method for semiconductor devices includes: providing a first multi-finger device and a second multi-finger device, wherein the gate-finger numbers between the first and second multi-finger devices are different; performing an open de-embedding, then the high-frequency test apparatus measuring a first intrinsic gate capacitance of the first multi-finger device and a second intrinsic gate capacitance of the second multi-finger device; calculating a slope according to the first and second intrinsic gate capacitances, and the first and second gate-finger numbers; performing a 3D capacitance simulation for computing the poly finger-end fringing capacitances; utilizing a long channel device for measuring the gate capacitance and extracting the intrinsic gate capacitance, then calculating an inversion channel capacitance per unit area; and computing a delta channel width of the semiconductor device, according to the slope, the poly finger-end fringing capacitance, and the inversion channel capacitance per unit area.

6 Claims, 5 Drawing Sheets

PARAMETER EXTRACTION METHOD FOR SEMICONDUCTOR DEVICE

BACKGROUND OF THE INVENTION (1) Field of the Invention

The invention relates to a parameter extraction method for semiconductor devices, and especially relates to a parameter extraction method for accurate determination of effective channel width in MOSFETs to fabricated in nano-scale technology.

(2) Description of the Prior Art

With the advancement of the electronic products, the size of the components in the electronic products continuously pursues the miniaturization to nano-scale dimensions. The electronic products emphasize the appeals, such as multi functions, small size, and light weight, so as to increase the functions of the integrated circuits and to minimize the size of the integrated circuits, for improving the performance.

With increasing the functions of the integrated circuits and minimizing the size of the integrated circuits, the isolation of internal components must be enhanced to avoid the impact of the internal components, such as contacting each other. Therefore, the shallow trench isolation (STI) technique has been widely used since 0.25 μm technology node and presently continued to nano-scale nodes. However, the original STI technique generally suffered current and field crowding, and even worse gate leakage near the top corner, due to sharp corner profile and poor formation of the gate oxide. Therefore, the top corner rounding becomes a key technique in STI process for solving the above problems. However, the top corner rounding (TCR) technique generally leads to an extension of the active region near the trench edge and the resulted increase of the effective channel width, namely delta channel width ($\Delta W$). The influence of the delta channel width becomes significant in narrow width devices, particularly for the multi-finger MOSFETs with aggressively scaled finger or channel width. The impact of delta width effect can be measured from current-voltage (I-V) characteristics, capacitance-voltage (C-V) characteristics, and high-frequency characteristics, etc. Therefore, the precise extraction of the effective channel width for miniaturized devices becomes indispensable for accurate characterization and modeling, which is particularly important for radio frequency (RF) and analog device and circuit design.

The conventional method for the delta channel width extraction is based on I-V characteristics, such as drain current ($I_{ds}$) and transconductance ($G_m$) measured from the MOSFETs with different channel widths. Both $I_{ds}$ and $G_m$ are a function of the effective mobility ($\mu_{eff}$) and the effective channel width ($W_{eff}$), which are critically dependent on the channel width, due to the STI stress and top corner rounding (TCR) induced delta channel width, respectively. However, said conventional method requires simultaneous best fitting to both $\mu_{eff}$ and $G_m$ in which $\mu_{eff}$ has to be known before the extraction of the delta channel width. The mentioned process introduces errors in the initially extracted $\mu_{eff}$, without consideration of the delta channel width. Therefore, multiple steps of iteration is required to update $\mu_{eff}$ with the previously extracted delta channel width and then to re-extract the delta channel width from the best fitting to the updated $\mu_{eff}$ and $G_m$. The second problem with this I-V based method is that a very wide MOSFET is needed to act as the reference device in which the influence from the STI stress and the delta channel width becomes extremely small and can be neglected. The last problem is related to the short channel devices in which the source/drain parasitic resistances ($R_{DS,ext}$) may dominate the channel resistance and have to be extracted and eliminated for accurate determination of $\mu_{eff}$. The deviation of the extracted $R_{DS,ext}$ will introduce additional errors in the extracted $\mu_{eff}$ and then the delta channel width.

Consequently, a new method, which can solve the mentioned problems with conventional method and then ensure accurate extraction of to the delta channel width and the effective channel width of the semiconductor devices becomes the major objective of the invention.

SUMMARY OF THE INVENTION

Accordingly, the objective of the invention is to provide a simple and precise parameter extraction method for semiconductor devices in order to get the delta channel width of the nano-scale metal-oxide-semiconductor field-effect transistor (MOSFET), and further to determine the effective channel width.

In one aspect, the invention provides a parameter extraction method for semiconductor devices to extract the delta channel width of the semiconductor devices. Wherein the semiconductor device includes at least one source, at least one drain and a multi-finger gate. The multi-finger gate has a plurality of gate fingers, and each gate finger has two ends, and every two adjacent gate fingers share the contacts at each end above the trench isolation region.

The steps of the parameter extraction method include: providing a first multi-finger device, a second multi-finger device and a long channel device, wherein the first multi-finger device has a total channel width and a first gate-finger number, the second multi-finger device has a total channel width and a second gate-finger number, and the long channel device has a gate length and a gate width; providing a high-frequency test apparatus for measuring the first multi-finger device to get a first gate capacitance, and for measuring the second multi-finger device to get a second gate capacitance, wherein the first gate-finger number is different from the second gate-finger number; performing an open de-embedding, to form a first dummy open pad on the first multi-finger device and to form a second dummy open pad on the second multi-finger device, then the high-frequency test apparatus measuring the first dummy open pad to get a first parasitic gate capacitance, and measuring the second dummy open pad to get a second parasitic gate capacitance; computing a first intrinsic gate capacitance according to the first gate capacitance and the first parasitic gate capacitance, and a second intrinsic gate capacitance according to the second gate capacitance and the second parasitic gate capacitance; determining a linear function according to the first intrinsic gate capacitance, the second intrinsic gate capacitance, the first gate-finger number and the second gate-finger number, and computing a slope of the linear function; performing a three-dimensional capacitance simulation for respectively computing the capacitances between the sidewall of the gate fingers and the active region of the source and between the sidewall of the gate fingers and the active region of the drain to get a first gate sidewall fringing capacitance, the capacitances between the sidewall of the gate fingers and the contact on the source and between the sidewall of the gate fingers and the contact on the drain to get a second gate sidewall fringing capacitance, and the capacitances between the contacts on the ends of the gate fingers and the active region of the source and the capacitance between the contacts on the ends of the gate fingers and the active region of the drain to get a poly finger-end fringing capacitance; the high-frequency test apparatus measuring the long channel device to get a third gate capacitance, and calculating an inversion channel capacitance per unit area, wherein the inversion channel capacitance per unit area is defined that the third gate capacitance divided by the product of the gate length multiplied by the gate width; and computing the delta channel width according to the slope, the poly finger-end fringing capacitance and the inversion channel capacitance per unit area. Finally, an effective channel width is calculated based on the delta channel width.

Wherein the first multi-finger device has a plurality of gate fingers, and each gate finger of the first multi-finger device has a first width. The second multi-finger device has a plurality of gate fingers, and each gate finger of the second multi-finger device has a second width. The total channel width of the first multi-finger device is the same as the total channel width of the second multi-finger device. The total channel width of the first multi-finger device is the first gate-finger number multiplied by the first width, and the total channel width of the second multi-finger device is the second gate-finger number multiplied by the second width. The semiconductor device has a total channel width, and the total channel widths of the semiconductor device, the first multi-finger device and the second multi-finger device are the same.

In an embodiment, the step of getting the first gate capacitance and the second gate capacitance includes: the high-frequency test apparatus measuring the first multi-finger device to get first scattering parameters, and measuring the second multi-finger device to get second scattering parameters; and respectively calculating the first gate capacitance according to the first scattering parameters, and the second gate capacitance according to the second scattering parameters.

In an embodiment, the steps of performing the open de-embedding include: providing a layout software, to form the first dummy open pad and a first dummy short pad on the first multi-finger device, to form the second dummy open pad and a second dummy short pad on the second multi-finger device; the high-frequency test apparatus respectively measuring the first dummy open pad to get first dummy open scattering parameters and measuring the first dummy short pad to get first dummy short scattering parameters; the high-frequency test apparatus respectively measuring the second dummy open pad to get second dummy open scattering parameters and measuring the second dummy short pad to get second dummy short scattering parameters; and calculating the first gate capacitance according to the first scattering parameters, the first dummy open scattering parameters and the first dummy short scattering parameters, and calculating the second gate capacitance according to the second scattering parameters, the second dummy open scattering parameters and the second dummy short scattering parameters.

Compared to the conventional method, the method of the invention precisely extracts the delta channel width and the corresponding effective channel width. By the layout of the multi-finger device, the varied gate-finger number and the corresponding gate width, the simulation of the poly finger-end fringing capacitance, the parameter extraction method for metal-oxide-semiconductor field-effect transistor (MOSFET) is effectively utilized to get the delta channel width.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for the purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

The parameter extraction method for semiconductor devices is utilized in an extraction software. The extraction software is executed by the computer, and applied for extracting the delta channel width of the semiconductor devices and especially applied for extracting the corresponding effective channel width of the metal-oxide-semiconductor field-effect transistor (MOSFET). The MOSFETs are applied in above 95% of the market of semiconductor industry. The method of the invention for computing the effective channel width of the MOSFETs is not only applied in the nano-scale device of mainstream but also extended to be applied in the next three dimensional techniques.

In order to obtain the delta channel width of the tested semiconductor devices, a long channel device and at least two multi-finger devices with different gate-finger numbers are provided in one embodiment. The semiconductor device includes at least one source, at least one drain and a multi-finger gate. The multi-finger gate has a plurality of gate fingers, and each gate finger has two ends, and every two adjacent gate fingers share the contacts at each end above the trench isolation region. The long channel device has a gate length and a gate width. The first multi-finger device has a total channel width and a first gate-finger number, and each gate finger has a first width. The second multi-finger device has a total channel width and a second gate-finger number and a second gate-finger number, and each gate finger has a second width. The total channel width of the first multi-finger device is the first gate-finger number multiplied by the first width, and the total channel width of the second multi-finger device is the second gate-finger number multiplied by the second width.

Figure 1:
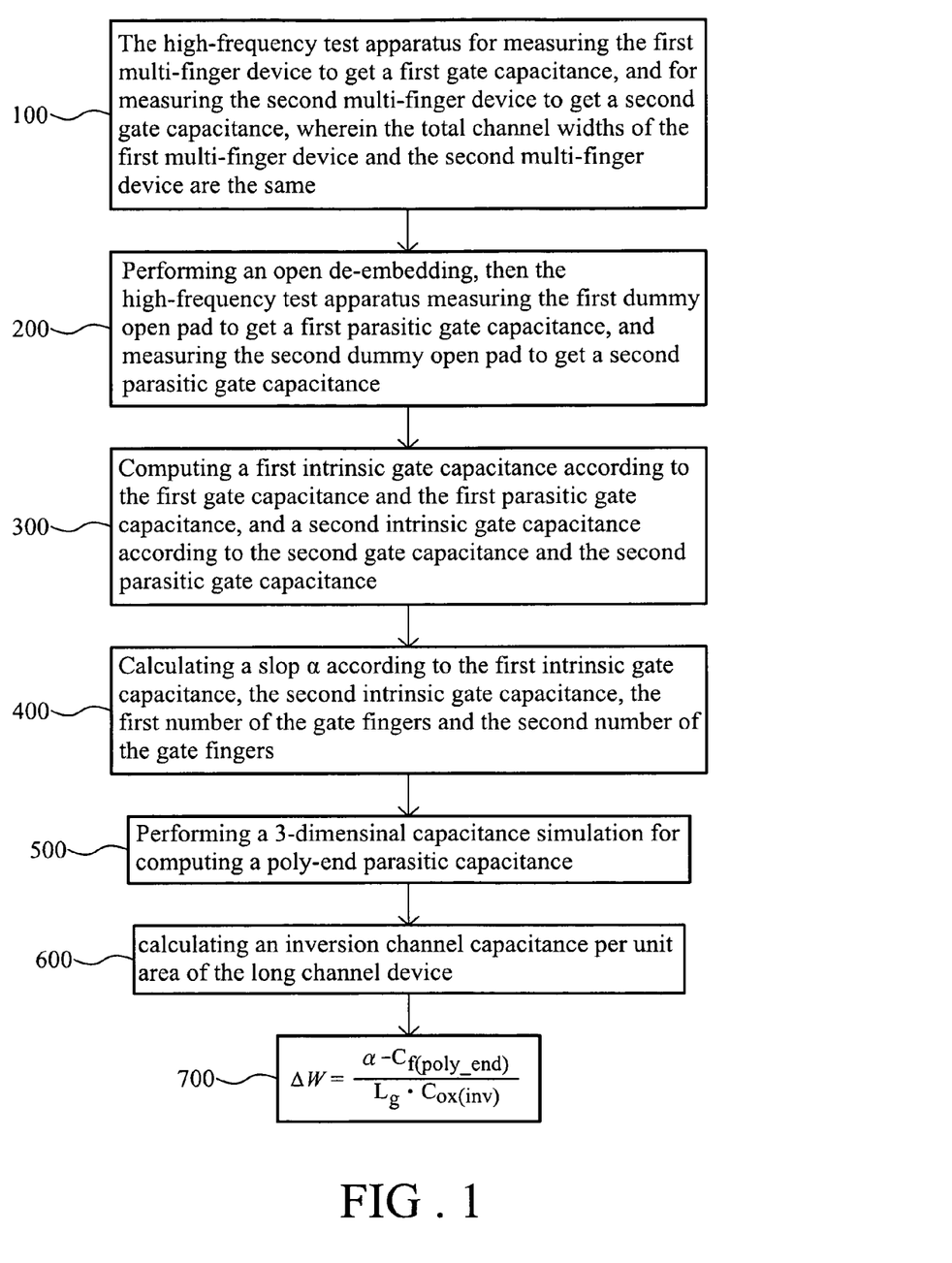
FIG. 1 is a chart showing the parameter extraction method for semiconductor devices.

Refer to FIG. 1 for a chart showing the parameter extraction method for the semiconductor devices. The parameter extraction method includes:

Step (S100): With the same total channel widths of the first multi-finger device and the second multi-finger device, the gate fingers numbers and the corresponding width of each gate finger are varied. Namely, the first gate-finger number $N_{F1}$ is different from the second gate-finger number $N_{F2}$, so the first width is varied based on the first gate-finger number $N_{F1}$, and the second width is varied based on the second gate-finger number $N_{F2}$.

Utilize the high-frequency measurement by providing a high-frequency test apparatus, such as a vector network analyzer, for measuring the first multi-finger device to obtain first scattering parameters (S parameters) and for measuring the second multi-finger device to obtain second S parameters. Transfer the S parameters into the Y parameters by the transfer matrixes, and obtain the corresponding gate capacitance $C_{gg,mea}$ from the Y parameters. The formula for getting the first gate capacitance and the second gate capacitance is as below:

$$C_{gg,mea} = Im(T_{11})/\omega$$

Wherein $C_{gg,mea}$ represents the gate capacitance before de-embedding, and $Im(Y_{11})$ is the imaginary part of $Y_{11}$ representing the port-1 self-term of the two-port Y parameters. Not that port-1 refers to the gate electrode. $\omega$ represents the angular frequency.

Step (S200): Perform an open de-embedding, to form a first dummy open pad and a first dummy short pad on the first multi-finger device and to form a second dummy open pad and second dummy short pad on the second multi-finger device by the layout. Then the first dummy open pad is measured by the vector network analyzer to get first dummy open S parameters, and the second dummy open pad is measured to get second dummy open S parameters. Transfer the S parameters into the Y parameters by the transfer matrixes, and obtain the corresponding parasitic gate capacitances from dummy open pads. The formula for getting a first parasitic gate capacitance and a second parasitic gate capacitance is as below:

$$C_{gg,OM1} = Im(Y_{11\_OM1})/\omega$$

Wherein $C_{gg,OM1}$ represents the parasitic gate capacitance of the dummy open_M1 pad, and $Im(Y_{11\_OM1})$ is the imaginary part of $Y_{11}$ representing the port-1 self-term of the two-port Y parameters. Not that port-1 refers to the gate electrode.

Step (S300): Compute a first intrinsic gate capacitance after de-embedding according to the first gate capacitance and the first parasitic gate capacitance, and a second intrinsic gate capacitance according to the second gate capacitance and the second parasitic gate capacitance. The intrinsic gate capacitance is defined as the capacitance between the gate itself and the active channel area under the gate. The formula for the intrinsic gate capacitance after de-embedding is as below:

$$C_{gg(DUT,OM1)} = C_{gg,mea} - C_{gg,OM1}$$

Figure 3:
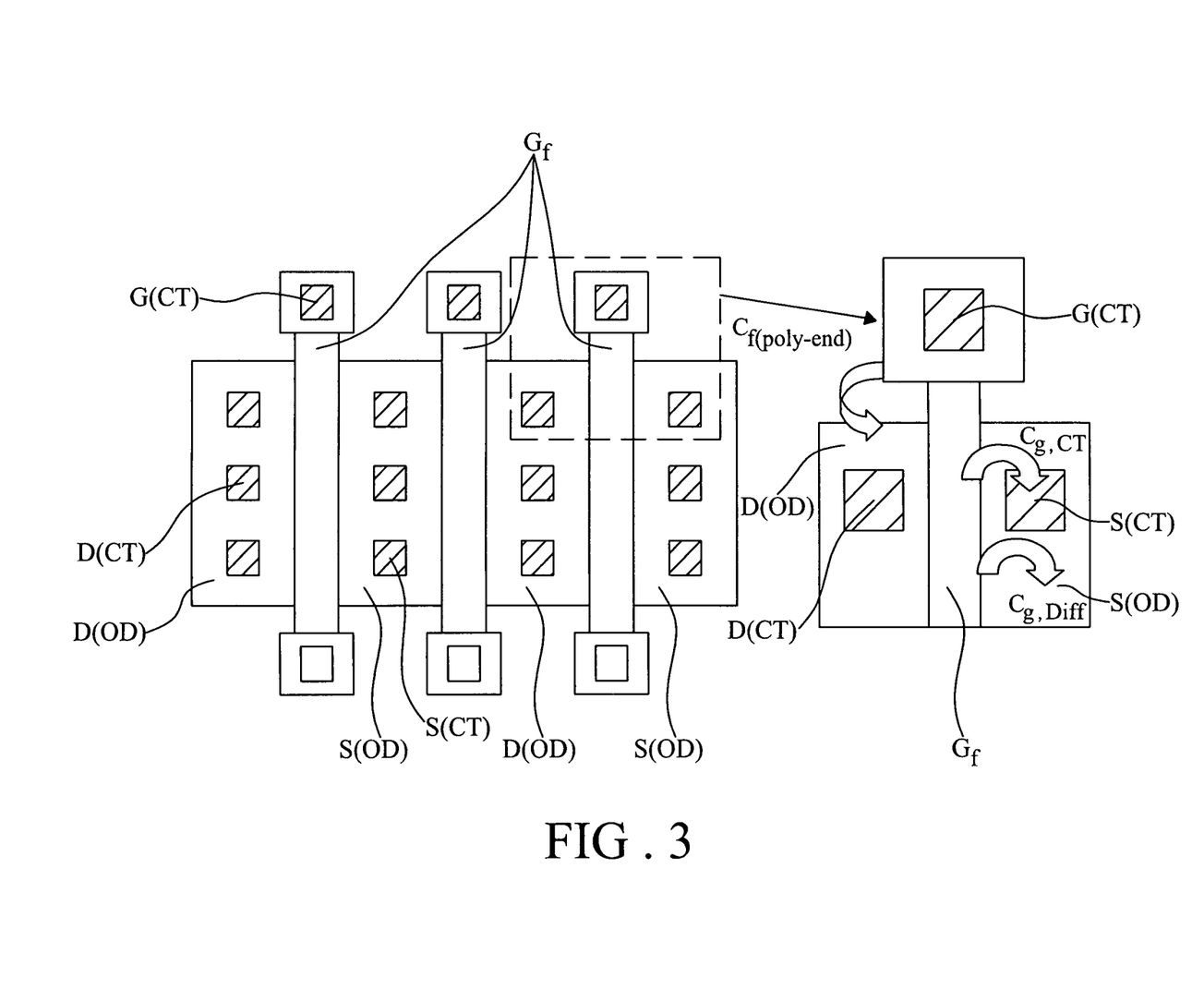
FIG. 3 is a schematic view of the multi finger device.

Step (S400): Determine a linear function according to the first intrinsic gate capacitance, the second intrinsic gate capacitance, the first gate-finger number and the second gate-finger number, and compute a slope α of the linear function. Wherein, the intercept of the linear function is defined as β, and β is composed of two terms, one is the intrinsic gate capacitance and the other is the gate sidewall fringing capacitance $C_{of}$. Refer to FIG. 3, the gate sidewall fringing capacitance $C_{of}$ is defined as the sum of a first gate sidewall fringing capacitance $C_{g,Diff}$ and a second gate sidewall fringing capacitance $C_{g,CT}$, wherein the first gate sidewall fringing capacitance $C_{g,Diff}$ is the capacitances between the sidewall of the gate fingers $G_f$ and the active region of the source S(OD) and between the sidewall of the gate fingers $G_f$ and the active region of the drain D(OD), and the second gate sidewall fringing capacitance $C_{g,CT}$ is the capacitances between the sidewall of the gate fingers $G_f$ and the contact on the source S(CT) and between the sidewall of the gate fingers $G_f$ and the contact on the drain D(CT).

Figure 2:
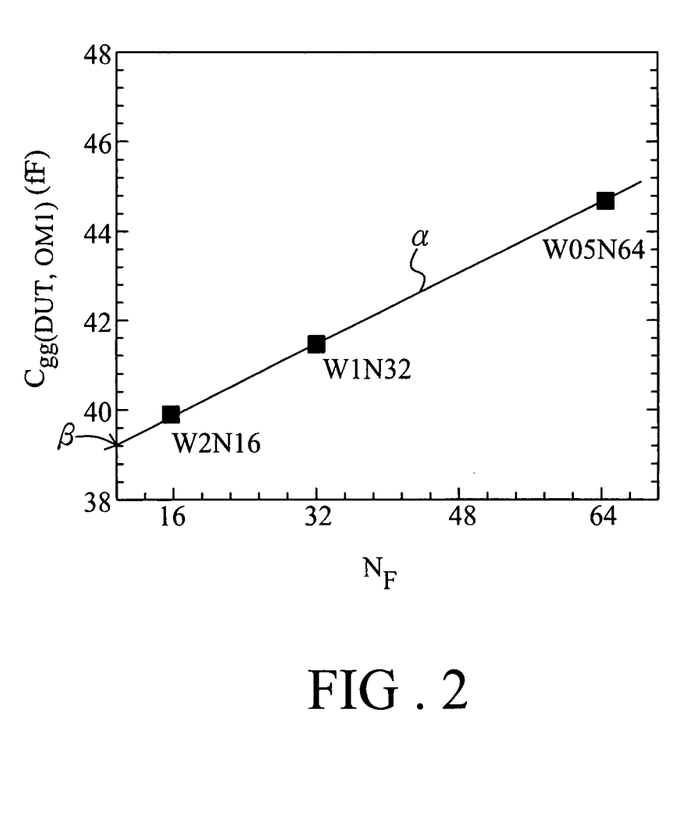
FIG. 2 is a schematic view of the linear function of the invention.

Refer to FIG. 2 for the linear function view, wherein X-axis represents the gate-finger number $N_F$ of the multi-finger device, Y-axis represents the corresponding intrinsic gate capacitance $C_{gg(DUT,OM1)}$. With the total channel width fixed at 32 μm, the first gate-finger number $N_{F1}$ is 16 and the first width $W_{F1}$ is 2 μm, and W2N16 represents the position point of the first intrinsic gate capacitance on the linear function view. With the total channel width fixed at 32 μm, the second gate-finger number $N_{F2}$ is 32 and the second width $W_{F2}$ is 1 μm, and W1N32 represents the position point of the second intrinsic gate capacitance on the linear function view. If a third multi-finger device is further provided, the third gate-finger number $N_{F3}$ is 64 and the third width $W_{F3}$ is 0.5 μm with the total channel width fixed at 32 μm, and W05N64 represents the position pint of the third intrinsic gate capacitance on the linear function view. Link said position points W2N16, W1N32 and W05N64 to form a line, and the slope α of the line is claulated and the intercept of the line at Y-axis is β.

Step (S500): Utilize a three-dimensional simulation software such as Raphael, and form a 3D structure of the multi-finger device based on the layout and the technology parameters. Perform a three-dimensional parasitic capacitance simulation for computing a poly finger-end fringing capacitance $C_{f(poly\_end)}$, which is the capacitance between the contacts on the ends of the gate fingers G(CT) and the active region of the source S(OD) and between the contacts on the ends of the gate fingers G(CT) and the active region of the drain D(OD), as shown in FIG. 3.

Step (S600): A third gate capacitance of the long channel device is measured by the vector network analyzer, and an inversion channel capacitance per unit area $C_{ox(inv)}$ of the long channel device after de-embedding is calculated, wherein the inversion channel capacitance per unit area $C_{ox(inv)}$ is defined that the third gate capacitance divided by the product of the the gate length multiplied by the gate width of the long channel device. The S parameters of the long channel device are measured by the vector network analyzer, and the S parameters are transferred into the Y parameters by the transfer matrix. The third gate capacitance $C_{gg,DUT}$ of the long channel device is calculated based on the Y parameters, and the inversion channel capacitance per unit area $C_{ox(inv)}$ is the third gate capacitance $C_{gg,DUT}$ divided by per unit area as below:

$$C_{ox(inv)} = C_{gg,DUT}/(W_g L_g),$$

wherein $W_g$ represents the gate width, and $L_g$ represents the gate length.

Step (S700): Base on the slope α, the poly finger-end fringing capacitance $C_{f(poly\_end)}$ and the inversion channel capacitance per unit area $C_{ox(inv)}$, the delta channel width $\Delta W$ of the semiconductor device is calculated as below:

$$\Delta W = \frac{\alpha - C_{f(poly\_end)}}{L_g \cdot C_{ox(inv)}}$$

Finally, an effective channel width $W_{eff}$ of the semiconductor device is calculated based on the delta channel width $\Delta W$ of the semiconductor device.

In said embodiment, the tested semiconductor device is a metal-oxide-semiconductor field-effect transistor with the multi-finger structure. When the semiconductor device is operated under high-frequency, the electrical characteristics of the semiconductor device is affected by the pads, interconnection lines, and lossy substrate. Therefore, the parasitic capacitances introduced by the mentioned sources like pads, interconnection lines, and lossy substrate have a significant impact on the scattering parameters and must be removed through a de-embedding process on the measured high frequency S-parameters. For removing the parasitic capacitances generated from the mentioned sources, the dummy open M1 pad and a dummy short M1 pad are formed on each multi-finger device. The parasitic gate capacitance, which is obtained by measuring said pads and is generated from the coupling effect between the metal pads, the metal wires, and lossy substrate, is deleted to obtain the intrinsic gate capacitance of the multi-finger device. The parasitic gate capacitances, which exist in parallel with the intrinsic gate capacitance of the multi-finger device, can be measured from the dummy open pad. The parasitic resistances and parasitic inductances, which exist in series with the intrinsic channel resistance of the multi-finger device, can be measured from the dummy short pad.

Figure 4:
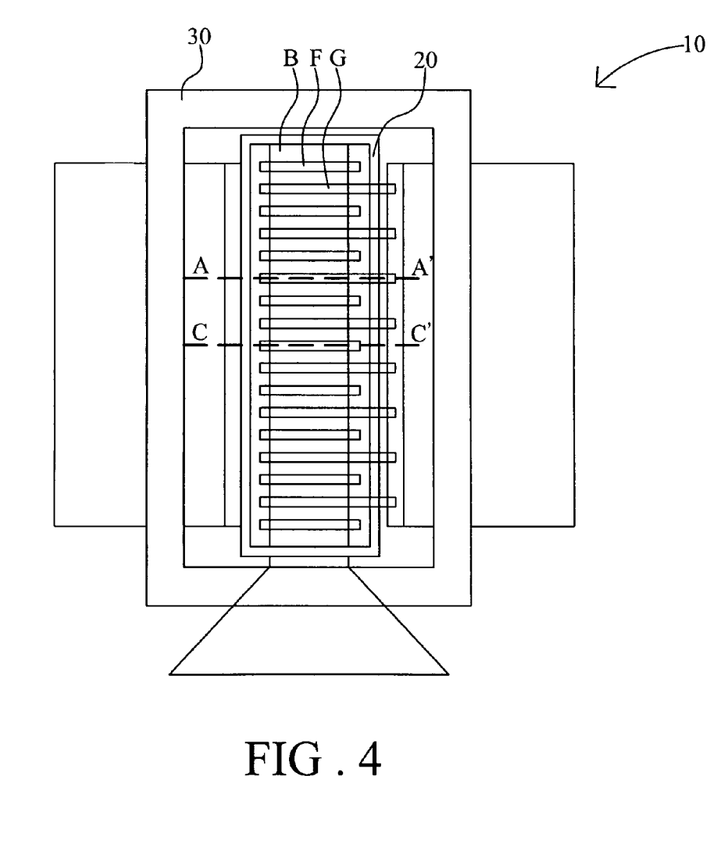
FIG. 4 is a top view of the dummy open pad layout for performing an open de-embedding to metal-1.
Figure 5:
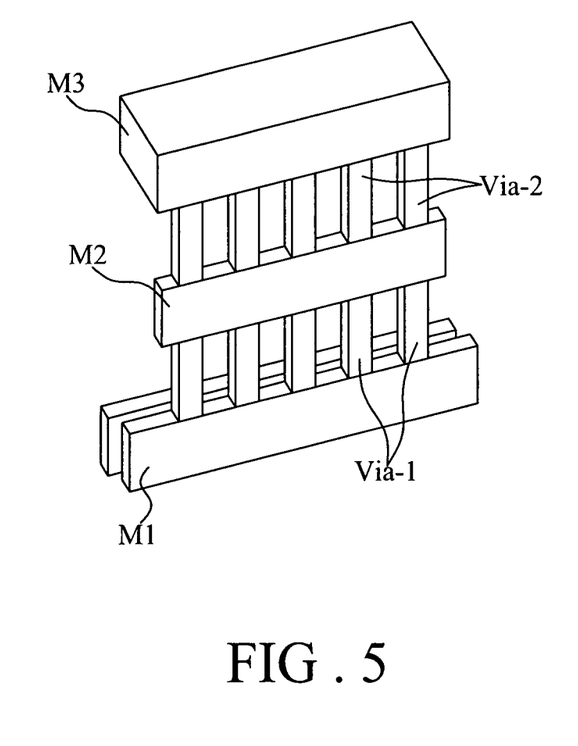
FIG. 5 is a sectional view of the cross section C-C' of FIG. 4.

Refer to FIG. 4 for a top view of the layout of the dummy open M1 pad 10 formed on the multi-finger device. The multi-finger device F represents the metal layer on the contact of the source. Refer to FIG. 5 for a sectional axonometric drawing of the section C-C' of FIG. 4. The metal layer of the multi-finger device F in FIG. 4 is orderly deposited by the first metal layer M1, the second metal layer M2 and the third metal layer M3 in FIG. 5. A connection structure Via-1 is between the first metal layer M1 and the second metal layer M2, and a connection structure Via-2 is between the second metal layer M2 and the third metal layer M3. The gate fingers in parallel rows of the multi-finger device F are disposed on the body B of the semiconductor device. The multi-finger device G in FIG. 4 represents the metal layer on the contact of the drain. Refer to FIG. 5 for a sectional axonometric drawing of the section A-A' of FIG. 4. The multi-finger device G in FIG. 4 is orderly deposited by the first metal layer M1 and the second metal layer M2 in FIG. 5, and the gate fingers of the multi-finger device G are connected by a first ring metal structure 20. A second ring metal structure 30, deposited by the first metal layer M1, the second metal layer M2 and the third metal layer M3, connects the body 13 of the semiconductor device and the N-well.

The delta channel width and the corresponding effective channel width are effectively obtained by the parameter extraction method for semiconductor devices. By the layout of the multi-finger device, the varied gate-finger number and the corresponding width, and the simulation of the poly finger-end fringing capacitance, the parameter extraction method for MOSFETs is carried out to get the delta channel width. Furthermore, the invention is utilized to obtain the effective channel width of the MOSFETs without additional devices besides the multi-finger MOSFETs. Compare to the conventional method, which requires an additional device with very wide width as the reference, the method of the invention can save the cost and improve the accuracy.

The application of the invention can be extended to the IC manufacturing industry, IC design industry, and etc., and the invention can be applied to the electronic devices characterization and analysis, measurement instruments, and the design automation software, such as ECAD or TCAD for nano-scale MOSFETs.

The foregoing description of the preferred embodiment of the invention has been presented for the purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary to limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit is the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A parameter extraction method for semiconductor devices, applied for extracting a delta channel width of a semiconductor device, the semiconductor device comprising at least one source, at least one drain and a multi-finger gate, wherein the multi-finger gate comprises a plurality of gate fingers, each of the gate fingers has two ends, and every two adjacent gate fingers share the contacts at each of the ends above a trench isolation region, the method comprising steps of:

to providing a first multi-finger device, a second multi-finger device and a long channel device, wherein the first multi-finger device has a total channel width and a first gate-finger number, the second multi-finger device has a total channel width and a second gate-finger number, and the long channel device has a gate length and a gate width;

providing a high-frequency test apparatus for measuring the first multi-finger device to get a first gate capacitance, and for measuring the second multi-finger device to get a second gate capacitance, wherein the first gate-finger number is different from the second gate-finger number;

performing an open de-embedding, to form a first dummy open pad on the first multi-finger device and to form a second dummy open pad on the second multi-finger device, then the high-frequency test apparatus measuring the first dummy open pad to get a first parasitic gate capacitance, and measuring the second dummy open pad to get a second parasitic gate capacitance;

computing a first intrinsic gate capacitance according to the first gate capacitance and the first parasitic gate capacitance, and computing a second intrinsic gate capacitance according to the second gate capacitance and the second parasitic gate capacitance;

determining a linear function according to the first intrinsic gate capacitance, the second intrinsic gate capacitance, the first gate-finger number and the second gate-finger number, and computing a slope of the linear function;

performing a three-dimensional capacitance simulation for computing the capacitance between the contacts on the ends of the gate fingers and the active region of the source and between the contacts on the ends of the gate fingers and the active region of the drain, to get a poly finger-end fringing capacitance;

the high-frequency test apparatus measuring the long channel device to get a third gate capacitance, and calculating an inversion channel capacitance per unit area, wherein the inversion channel capacitance per unit area is defined that the third gate capacitance divided by the product of the gate length multiplied by the gate width; and computing the delta channel width according to the slope, the poly finger-end fringing capacitance and the inversion channel capacitance per unit area.

2. The parameter extraction method for semiconductor devices of claim 1 further comprises: calculating an effective channel width according to the delta channel width.

3. The parameter extraction method for semiconductor devices of claim 1, wherein the first multi-finger device has a plurality of gate fingers, and each of the gate fingers of the first multi-finger device has a first width, the second multi-finger device has a plurality of gate fingers, and each of the gate fingers of the second multi-finger device has a second width, the total channel width of the first multi-finger device is the same as the total channel width of the second multi-finger device, the total channel width of the first multi-finger device is the first gate-finger number multiplied by the first width, and the total channel width of the second multi-finger device is the second gate-finger number multiplied by the second width.

4. The parameter extraction method for semiconductor devices of claim 3, wherein the semiconductor device has a total channel width, and the total channel widths of the semiconductor device, the first multi-finger device and the second multi-finger device are the same.

5. The parameter extraction method for semiconductor devices of claim 1, wherein the step of getting the first gate capacitance and the second gate capacitance comprises:

the high-frequency test apparatus measuring the first multi-finger device to get first scattering parameters, and measuring the second multi-finger device to get second scattering parameters; and respectively calculating the first gate capacitance according to the first scattering parameters, and the second gate capacitance according to the second scattering parameters.

6. The parameter extraction method for semiconductor devices of claim 1, wherein the step of performing the open de-embedding comprises:

providing a layout software; and the layout software respectively forming the first dummy open pad and a first dummy short pad on the first multi-finger device, the second dummy open pad and a second dummy short pad on the second multi-finger device.

* * * * *